United States Patent [19]

Schleiff et al.

[11] Patent Number: 5,138,232
[45] Date of Patent: Aug. 11, 1992

[54] POWER SUPPLY DEVICE FOR THERMIONIC EMITTING CATHODE

[75] Inventors: Reiner Schleiff; Tomas Baumecker, both of Hanau; Vladimir Ibl, Bad Homburg, all of Fed. Rep. of Germany

[73] Assignee: Leybold Aktiengesellschaft, Hanau, Fed. Rep. of Germany

[21] Appl. No.: 716,788

[22] Filed: Jun. 18, 1991

[30] Foreign Application Priority Data

Oct. 4, 1990 [DE] Fed. Rep. of Germany ....... 4031286

[51] Int. Cl.⁵ ............................................. H05B 7/00
[52] U.S. Cl. ..................................... 315/105; 315/106; 315/308
[58] Field of Search ................. 315/105, 106, 107, 308

[56] References Cited

U.S. PATENT DOCUMENTS 3,909,662  9/1975  Thomas et al. ..................... 315/106
4,314,182  2/1982  Thomas et al. ................. 315/106 X Primary Examiner—Robert J. Pascal
Attorney, Agent, or Firm—Koda and Androlia

[57] ABSTRACT

The invention described here is concerning a power supply device of a thermionic emitting cathode, an electron source in an electron vapor deposition plant. This device is provided with a transmitter whose secondary feeds the thermionic emitting cathode and whose primary is supplied with pulse width modulated and controlled heater current ($I_{HC}$). The control of this heater current ($I_{HC}$) is provided directly by introducing the heater current nominal value ($I_{HC\ nominal}$) from the outside or in a manner that the current emitted ($I_{EC}$) from the thermionic emitting cathode is monitored and fed galvanically decoupled to the controller. Here the galvanic decoupled connection is achieved by a pulse width modulated, optical signal.

15 Claims, 5 Drawing Sheets

POWER SUPPLY DEVICE FOR THERMIONIC EMITTING CATHODE

BACKGROUND OF THE INVENTION

1. Field of the Invention

The invention pertains to a power supply device for a thermionic emitting cathode.

2. Prior Art

Electron guns are used in numerous areas. One field of application is vaporization technology, in which solid materials, e.g. metals, are melted and then vaporized through the impact of electrons.

Several devices are known to generate electron beams. One of these devices is the so-called thermionic emitting cathode, which emits electrons by using the Edison effect. A metal filament heated by the passage of current either itself forms the directly heated thermionic emitting cathode or supplies its heat to the thermionic emitting cathode and to the thoriated tungsten cathode. Directly heated alkaline earth oxide cathodes are used if the heating capacity should be kept as low as possible. Power supply presents a special problem for directly heated thermionic emitting cathodes, which are used for electron vapor deposition plants. It should at least fulfill a number of requirements simultaneously and, for example, be high-voltage protected, short circuit-proof, dynamically controlled, suitable for continuous duty, small and light, as well as, low maintenance and easy to service.

A power supply for a thermionic emitting cathode has been described in DE-PS 29 28 301, but the design of the latter has not been described in detail. In this reference a pulsed transformer is provided, however, the latter serves as Wehnelt voltage control.

A phase-angle control with thyristors, a transductor, or a regulating transformer can be used to control the heater current for thermionic emitting cathodes generally located on the primary of a filament transformer which is monitored by a current transformer. These controllers have the disadvantage that they weigh too much and that they are oversized, besides, they show high heating losses. Low efficiency is the result.

If an electron beam vaporizer is fed by one high-voltage source only, monitoring the emission current is made relatively simple. Here, the anode of the high-voltage rectifier is grounded across a resistor. The voltage across the resistor is proportional to the emission current. It is a disadvantage that the measurement is not potential related.

However, if several electron beam vaporizers are connected to one high-voltage source, then the measuring method of a single current monitoring as described above is not possible. An added total current of all electron beam vaporizers builds up at the measuring reference resistor. In such a case the emission current must be monitored with dc converters at outputs with high-voltage potential. This has the advantage of being galvanically decoupled. However, opposing this advantage is the high technical effort with mostly inaccurate detection of emission current.

Monitoring of short circuits is of great importance for power supply devices of thermionic emitting cathodes because during a short circuit the dynamic control of the emission current must be interupted immediately to prevent arcing. As a rule, the monitoring of short circuits is carried out by a resistor on a high-voltage generator, which also converts the dynamic increase of the short circuit current into a proportional voltage signal that will be analyzed afterwards. Here, too, the disadvantage is the potential related monitoring.

SUMMARY OF THE INVENTION

The object of the invention is to create an efficient high-voltage protected and short circuit-proof power supply for a thermionic emitting cathode, which can operate continuously and required little maintenance.

This objective is achieved by virtue of the features described in claim 1.

The advantage achieved with this invention consists especially in the fact that cathode heating, i.e., the power supply of the cathode, can be controlled either through a heater current or through an emission current. If this power supply is small, a galvanically decoupled monitoring of the emission current is guaranteed for one or several electron beams. Size can be reduced substantially with the use of a medium frequency controlled, pulse-width modulated power amplifier with transmitter. Galvanical decoupling of the load- and control circuit is the result from an infrared transmitter, which also permits fast and direct short circuit monitoring. The infrared transmitter offers also another advantage; it allows that the monitored short circuit current and its convertion into a proportional current can be processed fast in subsequent control units that shuts down power transistors so that a short circuit interuption can be guaranteed to prevent arcing in the vacuum tank. In addition to this active short-circuit current limitation is another passive limiting device planned which consists of ferrite cores that are switched parallel to the thermionic emitting cathode across high-voltage power transmission lines.

BRIEF DESCRIPTION OF THE DRAWINGS

A design example of the invention is displayed in a drawing and will be described in detail as follows.

DETAILED DESCRIPTION OF THE INVENTION

Figure 1:
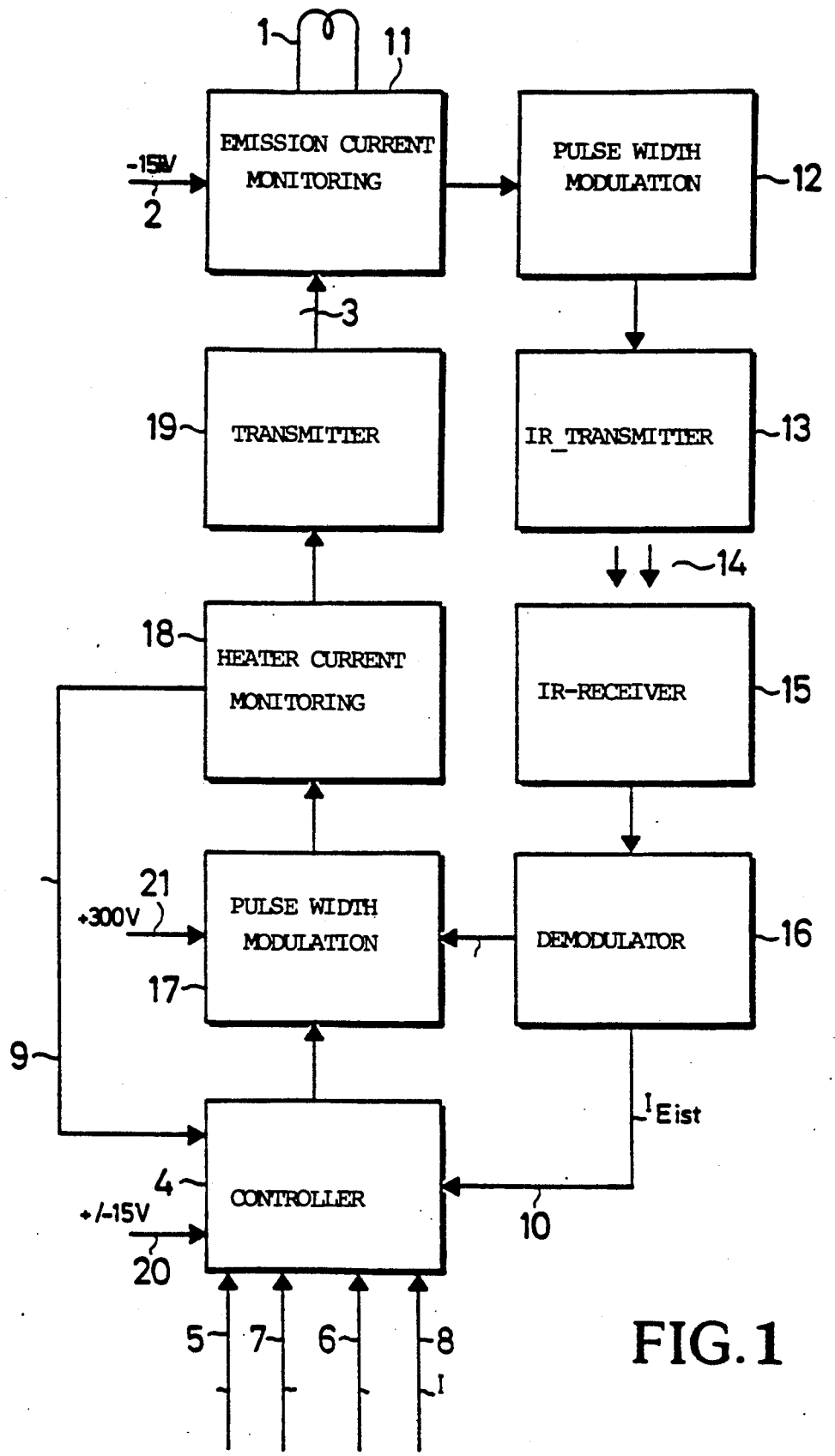
FIG. 1 block diagram of one arrangement for a thermionic emitting cathode heater.

FIG. 1 shows a thermionic emitting cathode 1 to be heated which is at a 15 kV dc voltage 2. This high-voltage is the accelerating voltage for the electrons emitted from the thermionic emitting cathode.

The invention described here has a controller 4 which can monitor and control heater current $I_{HC}$, as well as, emission current. The first input 5 of the controller 4 indicates a heater current activation which enables the heater current to actually flow. Here, heater current activation is understood as the activation from the heater current controller in the controller 4. Since the thermionic emitting cathode 1 can only operate under vacuum conditions, i.e. at a pressure of $p<1*10^{-3}$ mbar—when atmosphere is present oxydation would destroy it in a very short time—vacuum generated interlocking must be provided so that the thermionic emitting cathode can be heated. The power supply must be switched off or shut off until the pressure has reached approximately $1*10^{-3}$ mbar. At the same time, a second input 6 is provided to activate the emission current. Emission activation is understood hereby, as the activation of an emission current controller in controller 4. An activation of this emission current controller can only occur if safety interlocking is in effect and the vacuum chamber door is shut, pressure is at $p<1*10^{-3}$ mbar and cooling water is available. In addition, the electron-optical beam deflection must operate flawlessly and the vaporizing material must be in position. When high-voltage is available the dynamic control of the emission current is activated, i.e. an automatic switch from heater current control to emission current control takes place.

If high-voltage, e.g. in the event of an arc-over, is no longer available, a switch over to the heater current control takes place. The power supplied to the thermionic emitting cathode by the heater current controller will be adjusted proportionally to the required emission current so that electrons can be emitted from the cathode. Therefore, the heater current is directly proportional to the emission current. Nominal values for the heater current are supplied across input 7 to the controller 4, whereas the nominal values for the emission current are given to input 8 of the controller 4.

In addition to the nominal values for the heater current and emission current the controller 4 is also supplied with the actual values of the heater current and emission current across the inputs 9 and 10.

With the help of an arrangement 11 the emission current is monitored and fed to a device 12. This device 12 carries out a pulse width modulation of the emission current $I_{EC}$ and controls with the modulated current an infrared transmitter 13. The impulse width modulated signal 14 will be directed to the infrared receiver 15, which is connected to a demodulator 16. This demodulator restores analog signals from pulse width modulated signals and transmits these across input 10 to controller 4. The advantages of an infrared transmitter as a galvanic decoupled connection opposed to an isolation transformer is the considerable reduction in weight and volume. In addition, diodes of an infrared transmitter operate almost without heat development.

The current given from controller 4 to cathode 1 is pulse width modulated in a modulator 17 and monitored by an actual current monitor 18 and recoupled to the controller 4. The pulse width modulated heater current is supplied to the primary of a transmitter 19, whose secondary is connected to the thermionic emitting cathode 1. The transmitter 19 involved is preferably a ferrite transformer pulsed at a medium frequency of 25 KHz. Hence follows improved power volume and considerable weight reduction.

Figure 2:
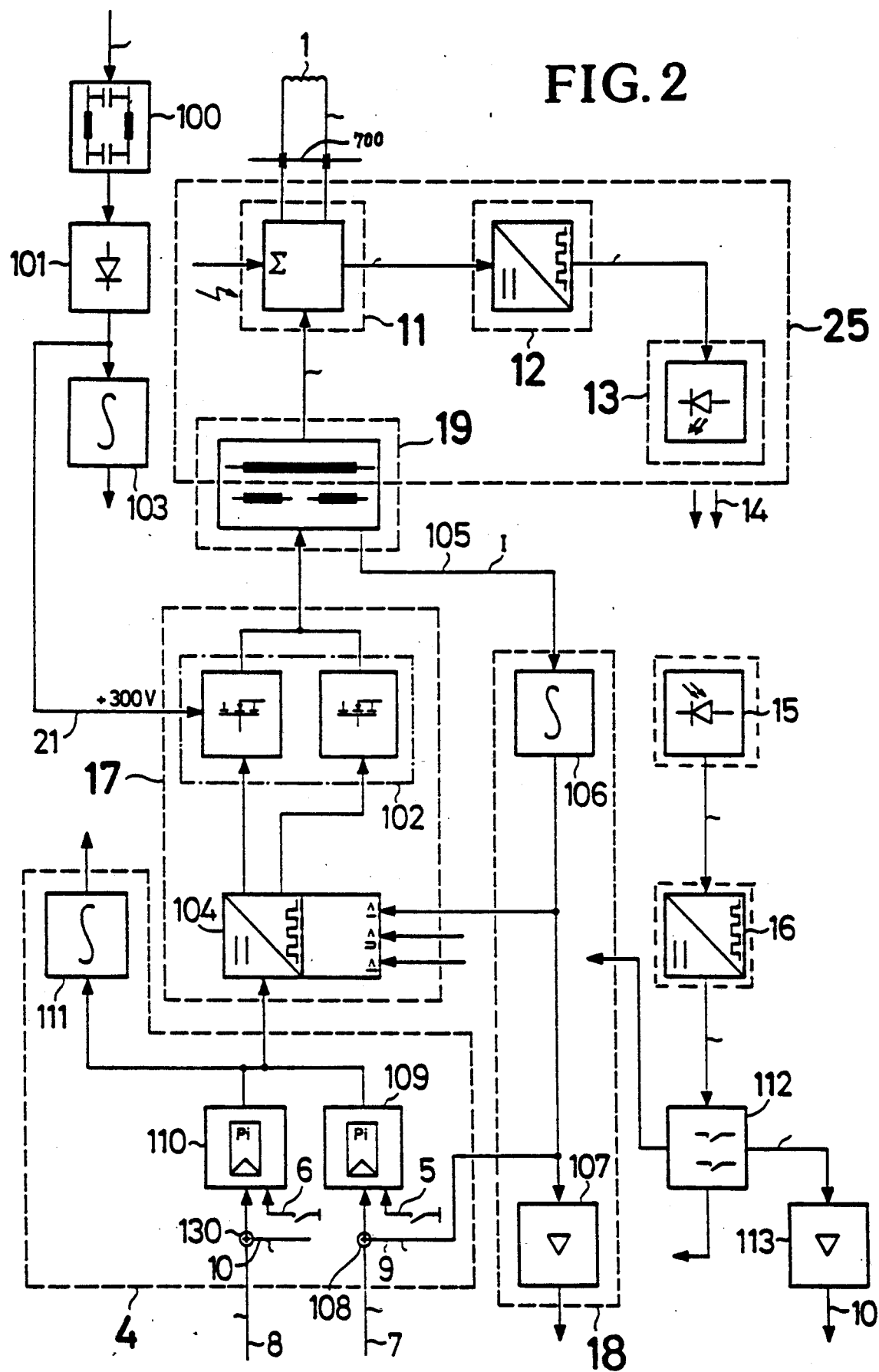
FIG. 2 detailed arrangement of a block diagram according to FIG. 1

FIG. 2 shows once more the detailed block diagram of FIG. 1. Those blocks that are according to the blocks of FIG. 1 are outlined in dots in FIG. 2.

The power supply for the entire arrangement is fed from a common a.c. mains source $U_E$ with 230 V and 48 to 63 Hz. This a.c. voltage is fed across a surge protector 100 to power electronics. The objective of this surge protector 100 is to avoid induced interference from power electronics to mains. The a.c. mains voltage fed across the power surge 100 is rectified by a rectifier which is a (non-controllable) bridge rectifier. Then the rectified voltage is fed across a line 21 to a pre-amplifier with a power amplifier 102 and across a galvanic decoupled connection not shown here. 103 indicates a time integrated voltage control that has a direct effect on the pulse width modulator 104.

A pulse generator 104 is connected in series to a power amplifier 102, in which control signals from the controller 4 are converted into pulses. Pulses supplied by the power amplifier 102 are fed to the primary of a transmitter 19 with a galvanic decoupled connection and high-voltage isolation and galvanically decoupled heating current monitoring. The monitored heater current $I_{HC\ actual}$ is fed across line 105 to the effective value generator 106 developed as an amplifier. The effective heater current $I_{HC\ actual}$ is processed in a rectifier 107 and output as 0 . . . 10 V. The heater current $I_{HC\ actual}$ is fed to an actual/nominal comparator 108 in controller 4, which is also supplied with the heater current nominal value $I_{HC\ nominal}$.

The difference of the nominal value and the actual value reaches a cathode heater controller 109, which regulates the heater current just below the electron emitting power level. The heater current activation 5 is connected to the cathode heating controller 109, which is a PI controller.

The controller 4 is provided with an emission current controller 110 corresponding to the cathode heater controller 109, to which the difference of the emission current nominal value $I_{EC\ nominal}$ and the emission current actual value $I_{EC\ actual}$ is supplied. This emission current controller 110 is also connected to an activator 6.

The output signals of the controllers 109, 110 are supplied to the pulse generator 104, as well as, to a device that recognizes cathode malfunctioning 111, which contains a time integrated voltage monitor and reacts to the maximum of control signals.

The accelerating voltage is supplied by the secondary winding of the transmitter 19 across the emission monitor 11. The emission current $I_{EC\ actual}$ flows from the emission current monitor 11 to the pulse width modulator 12, which carries out the pulse width modulation of the emission current which is present as d.c. current and feeds it to the infrared transmitter 13.

The emission current is supplied as an optical signal 14 from the infrared transmitter 13 to the infrared receiver 15, whose pulse width modulated output signal is supplied to the demodulator 16, which reconverts the latter into a d.c. signal and amplifies it at the same time. The signal processed in this manner is supplied to a device 112, which sets a limiting value specific to the vaporizer. If the emission current $I_{EC\ actual}$ exceeds the given limiting value, it will directly interfere with the pulse width modulation through device 112.

The emission current $I_{EC\ actual}$ is fed through a rectifier circuit 113 to line 10.

Figure 3:
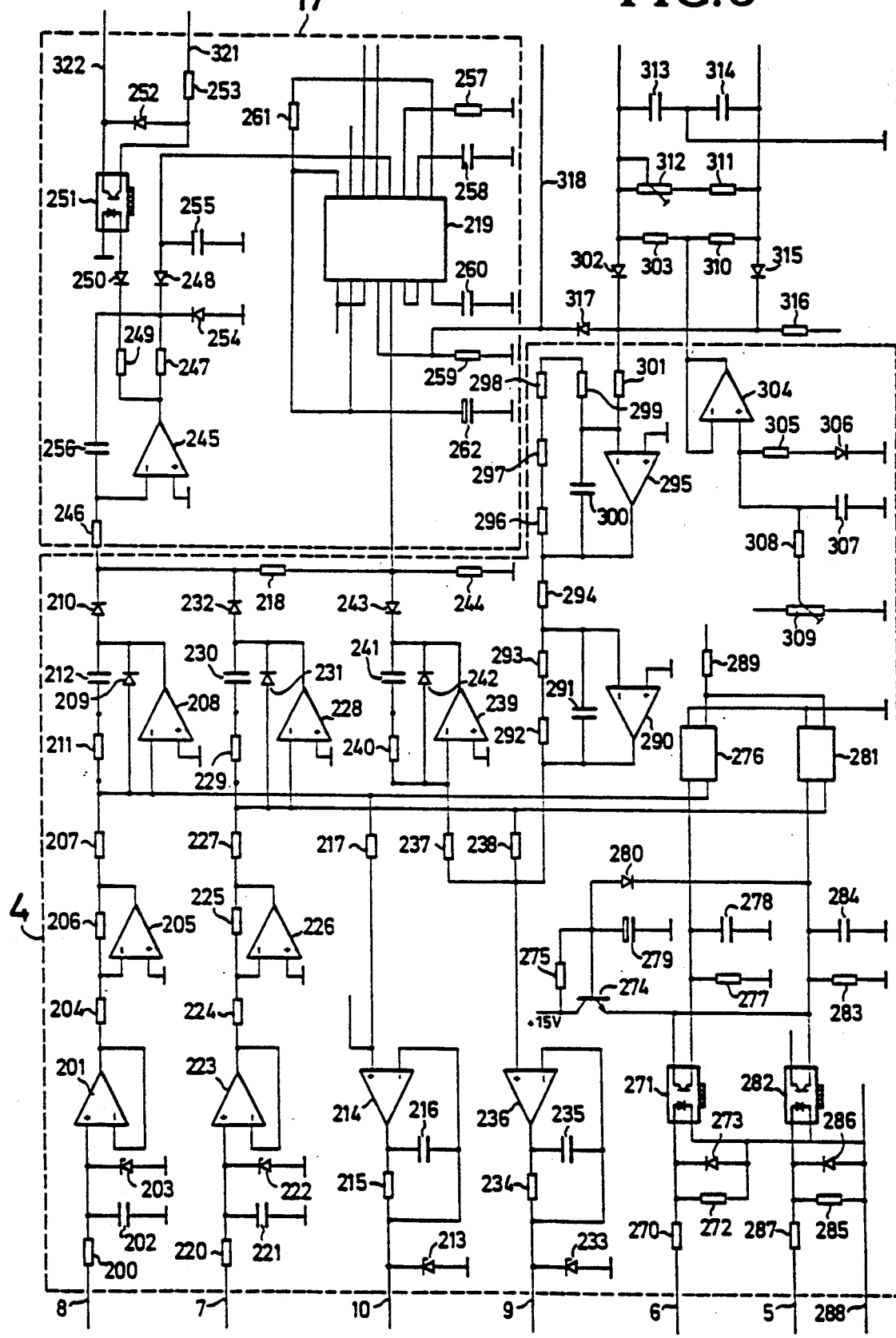
FIG. 3 wiring diagram with a controller, as well as, a pulse width modulation circuit for the heater current and the emission current of the thermionic emitting cathode heater.

FIG. 3 shows in detail the inputs 5 to 8 of the controller 4, the controller 4 itself and the pulse width modulator 17.

The nominal value $I_{EC\ nominal}$ of the emission current is fed across input 8 of controller 4 and across a resistor 200 to the positive input of an operating amplifier 201, which is grounded across a capacitor 202 and a Zener diode 203. The output of the operating amplifier 201 is fed back to the negative input connected across a resistor 204 with the negative input of an operating amplifier 205, whose positive input is grounded. The output of this operating amplifier 205 is fed back across a resistor 206 to the negative input.

In addition, the output of the operating amplifier 205 is connected across a resistor 207 to the negative input of an operating amplifier, whose positive input is grounded and whose output is connected to the cathode of a diode 209 and to the anode of a diode 210. The anode of the diode 209 is located at the connection between the resistor 207 and an additional resistor 211. A capacitor 212 is provided between the resistor 211 lastnamed and the anode of the diode 210.

The emission current $I_{EC\ actual}$ flows from the output of the amplifier 214 across a resistor 215 to the output 10. A Zener diode 213 whose anode is grounded is located at output 10. The negative input of the amplifier 214, as well as, the capacitor 216 are located at the cathode of the Z-diode 213. The other side of the capacitor 216 is located at the output of the amplifier 214.

The heater current $I_{EC\ actual}$ flows from the output of the amplifier 236 across a resistor 234 to output 9. A Zener diode with its anode counter to ground is located at output 9. The negative input of the amplifier 236, as well as, the capacitor 235 are located at the cathode of the Z-diode 233. The other side of the capacitor 235 is located at the output of the amplifier 236.

The emission current $I_{EC\ actual}$ is located at the positive input of the operating amplifier 214, as well as, at the resistor 217. The other terminal of the emission current $I_{EC\ actual}$ is located at the negative terminal of the operating amplifier 208. Thus the operating amplifier 208 carries out a actual/nominal comparison and supplies a signal across resistor 218 to the pulse width modulator and that to the input of an integrated modulator component 219.

The heater current is supplied in a similar manner to this component 219 as the emission current $I_E$ reaches the modulator component 219. The nominal value of the heater current $I_{HC\ nominal}$ is supplied to input 7 of controller 4 and from there to the comparator operating amplifier 228 with wiring elements 229 to 232 across components 220 to 227. The actual value of the heater current $I_{HC\ actual}$ reaches the operating amplifier 239 with the wiring elements 240 to 243 across a resistor 237 in the same manner. The anode of the diode 243 is located at the component 219.

The output signal of an operating amplifier 245 is supplied to another input of the modulator component 219. The negative input of the operating amplifier 245 is located at a resistor 246, which is connected to the cathode of the diode 210. The output of the operating amplifier is not only connected to the modulator component 219 across a resitor 247 and a diode 248, but also to an optoelectronic coupler 251 across a resitor 249 and a diode 250, whose output is connected in parallel to the diode 252 and connected in series with a resistor 253. The cathode of the diode 248 is connected to the cathode of another diode 254, whose anode is grounded. As already mentioned, the anode of the diode 248 is connected to the modulator component 219 and also to the capacitor 255, which is grounded. The feedback branch of the operating amplifier 245 is provided with a capacitor 256, which is connected with the resistor 246.

The modulator component 219 has still other inputs, of which one is grounded across a resistor 257, another one across a capacitor 258, and another one across a resistor 259 and another one across a capacitor 260. Besides three inputs are coupled with each other across a resistor 261, grounding another input across an electrolytic capacitor 262.

The input for activating the emission is connected across a resistor 270 to an optoelectronic coupler 271, whose input is wired to a resistor 272 and a diode 273 connected parallel here to. The output of the optoelectronic coupler 271 is located at the emitter of the transistor 274, whose collector is at +15 V, as well as, at a resistor 277 and also at an analog switch 276, whose input is connected parallel to a resistor 277 and a capacitor 278. The base of the transistor 274 is located at a capacitor 279, which is grounded, as well as, at a anode of a diode 280, whose cathode is connected to the input of a controller 281. The second input of this controller 281 is connected to the output of an optoelectronic coupler 282, to whom a resistor 283 and a capacitor 284 are connected parallel. The resistor 285 and a diode 286 are connected parallel to the input of the optoelectronic coupler 282. The cathode of the diode 286 is located at the input 5 across a resistor 287, whereas the anode of this diode 286 is connected to the input 288.

The power supply of the controllers 276, 281 is provided by a power source, which is located across a resistor 289 at these controllers 276, 281. The positive input of the operating amplifier 236 is connected to the output of the operating amplifier 290, whose feedback branch has a capacitor 291 and two resistors 292, 293 connected in series to each other. The negative input of this operating amplifier 290 is connected across a resistor 294 to the output of another operating amplifier 295, whose feedback branch is connected to four resistors 296 to 299 —and parallel to that—to a capacitor. Whereas the positive input of the operating amplifier 295 is grounded, its negative input is located across a resistor 301, a diode 302 and a resistor 303 at the output and the negative input of the operating amplifier 304, whose positive input is grounded across a resistor 305 and a diode 306. Switched parallel to the series connection, resistor 305–diode 306, is a capacitor 307, which has one terminal grounded and the other terminal is connected to a potentiometer 309 across a resistor 308. The resistor 303 at the output of the operating amplifier 304 is part of a voltage divider, whose second resistor is indicated by 310. Switched parallel to this voltage divider are on one hand a resistor 311 with a potentiometer 312 and on the other hand two capacitors 313, 314 connected in series, whose center tabs are grounded. One terminal of each resistor 310, 311 and of the capacitor 314 are connected to each other and are located at the anode of a diode 315, whose cathode is located at a power source and at the anode of another diode 317 across a resistor 316.

The cathode of the diode 317 lastnamed is connected to the terminal of the resistor 259, as well as, to a lead 318.

Figure 4:
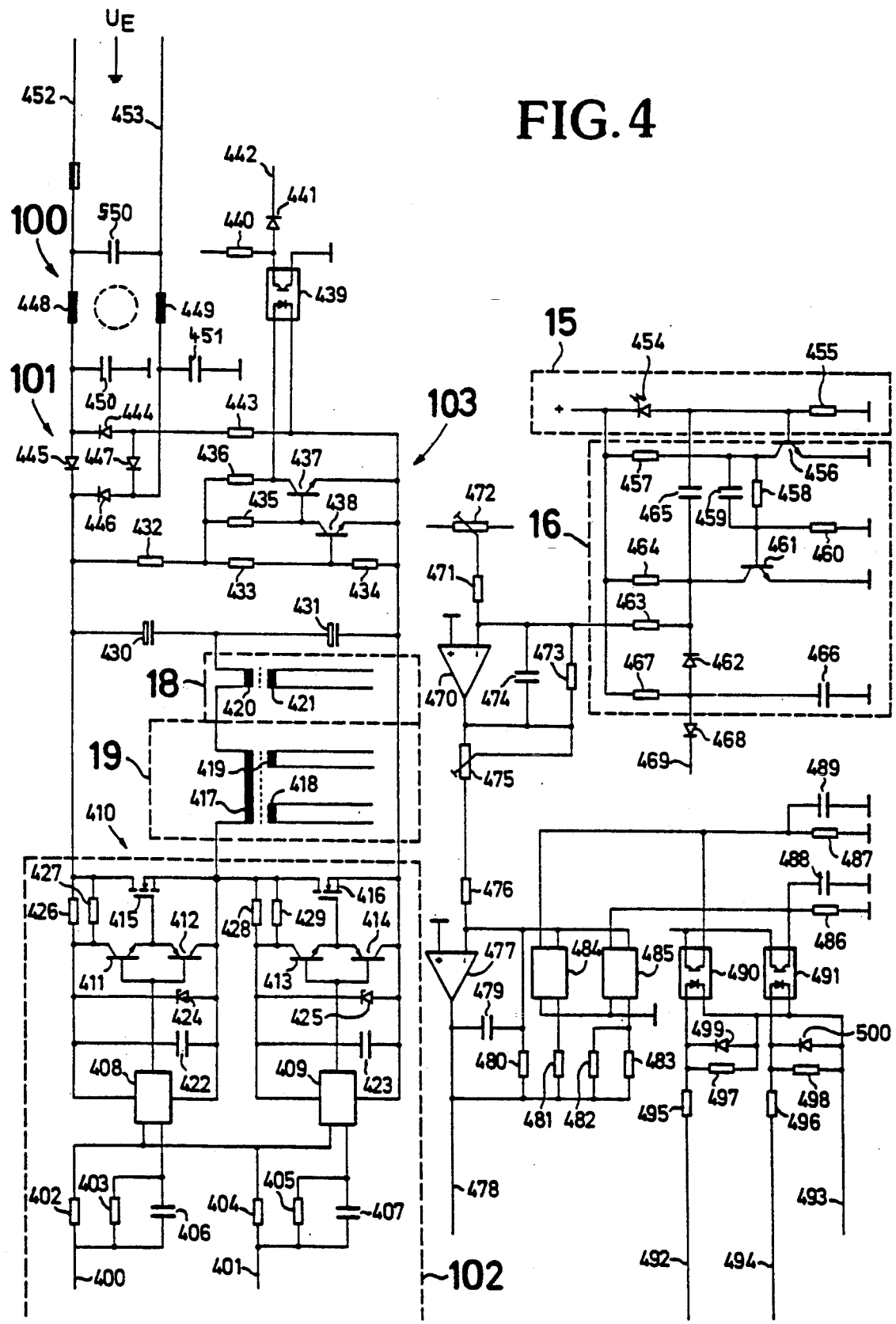
FIG. 4 pulse width modulation and a transformer connected in series to the thermionic emitting cathode heater.

FIG. 4 shows in detail the driver stage of the pulse width modulator 102, the power supply 100, 101, the heater current monitoring 18 and control 103, the transmitter 19, the infrared receiver 15 and the demodulator 16. The reference numbers 400 and 401 indicate the outputs of the modulator components 219 from FIG. 3 that are connected to controllers 408 or 409 across resistors 402, 403 or 404 405 and capacitors 406 or 407. Each of these controllers 408, 409 controls two fast pulsed transistors 411, 412 or 413, 414.

Two of these transistors 411, 412 or 413, 414 are connected at the same time to their bases and to their emitters. The respective connection point of the emitter is located at the control electrode of the field effect transistor 415 or 416. The field effect transistor 415 is opened and closed by signals that are fed by the supply line 400, whereas the field effect transistor 416 is opened and closed by signals that are fed by the supply line 401.

Pulsed currents are fed to the primary winding 417 of the transmitter 19 and transformed to two secondary windings 418, 419. The current flowing through the primary winding 417 flows also through the primary winding 420 of a current transformer, which is provided as a current monitor 18. The secondary windings 418, 419 of the transmitter 19 are connected to the heater spiral of the thermionic emitting cathode, which is not shown in FIG. 4, whereas the secondary winding 421 of the heater current monitor 18 is connected to the controller 4.

Switched parallel to the switching transistors 411, 412 or 413, 414 is still one capacitor each 422 or 423 and one Zener diode each 424 or 425. Besides the collectors of the transistors 411 or 413 are located across resistors 426, 427 or 428, 429 connected in parallel at an electrolytic capacitor 430, which is connected to another electrolytic capacitator 431, such that the primary winding 420 of the current monitor 18 is connected to the connection line between the two capacitors 430, 431.

Three resistors 432, 433, 434 connected in series are provided parallel to the capacitors 430, 431, leading a branch from the connection line between the resistors 432, 433 to two different resistors 435, 436, from which the resistor 436 is located at the collector of a first transistor 437 and the resistor 435 is located at the collector of a second transistor 438. The emitters of the transistors 437, 438 are connected to each other and are located at that input of the opto-electronic coupler 439, whose other input is located at the collector of the transistor 437. The output of the opto-electronic coupler 439, which is connected across resistor 440 to a power source, leads across a diode 441 to a line 442. The emitters of the transistors 437, 438 are also connected across a variable resistor 443 to a rectifier unit consisting of 4 diodes 444 to 447, which is located at two variable inductivities (inductive resistors) 448, 449. A capacitor 450 is grounded at the inductivity (inductive resistor) 448, and one capacitor 451 is grounded at the inductivity (inductive resistor) 451. A capacitor 550, which is connected to the lines 452, 453, is connected to the input across the inductivities (inductive resistors) 448, 449.

The infrared receiver 15, shown in FIGS. 1 and 2, is shown in FIG. 4 as an infrared sensitive diode 454, whose cathode is at plus potential and whose anode is grounded across a resistor 455. The electrical signal generated by the infrared receiver 15 is fed to the base of the transistor 456, whose emitter is grounded and whose collector is located at two resistors 457, 458 and at a capacitor 459, such that the terminal of the resistor 458 is connected to a grounded resistor 460 and to the base of the transistor 461. The collector of this transistor 461 is connected to the cathode of the diode 462, to two resistors 463, 464 and to a capacitor 465, such that this capacitor 465 is located at the anode of the diode 454.

The anode of the diode 462 is connected to a grounded capacitor 466, as well as, to a resistor 467 and the anode of the diode 468, whose cathode is lead to line 469. The resistor 464 is connected with this terminal that faces away from the diode 462, to the negative input of an operating amplifier 470, whose positive input is grounded. Besides the negative input of the operating amplifier 470 is located across a resistor 471 to a potentiometer 472, through which the latter is supplied with power. Furthermore, the output of the operating amplifier 470 is fed back to the negative input across a capacitor 474 connected in parallel to a resistor 473.

From the output of the operating amplifier 470 across a potentiometer 475, whose tap is in connection with the capacitor 474 and the resistor 473, a connection leads to another resistor 476, which is connected to the negative input of the operating amplifier 477. The output of this operating amplifier 477 leads to a line 478, which is also connected to a capacitor 479 and four resistors 480 to 483, such that the resistor 480 is located at the negative input of the operating amplifier 477, whereas the resistor 481 is connected to the input of the controller 484 and the two other resistors 482, 483 are connected to the input of another controller 485.

The analog switches 484 or 485 are grounded across a parallel switch consisting of resistor 486 or 487 and capacitor 488 or 489. They are also connected to the outputs of optoelectronic couplers 490 or 491, whose inputs are located at line 492, 493 or 494, 493 and across the resistors 495 or 496 and parallel switches consisting of one resistor 497 or 498 and one diode 499 or 500 each.

Figure 5:
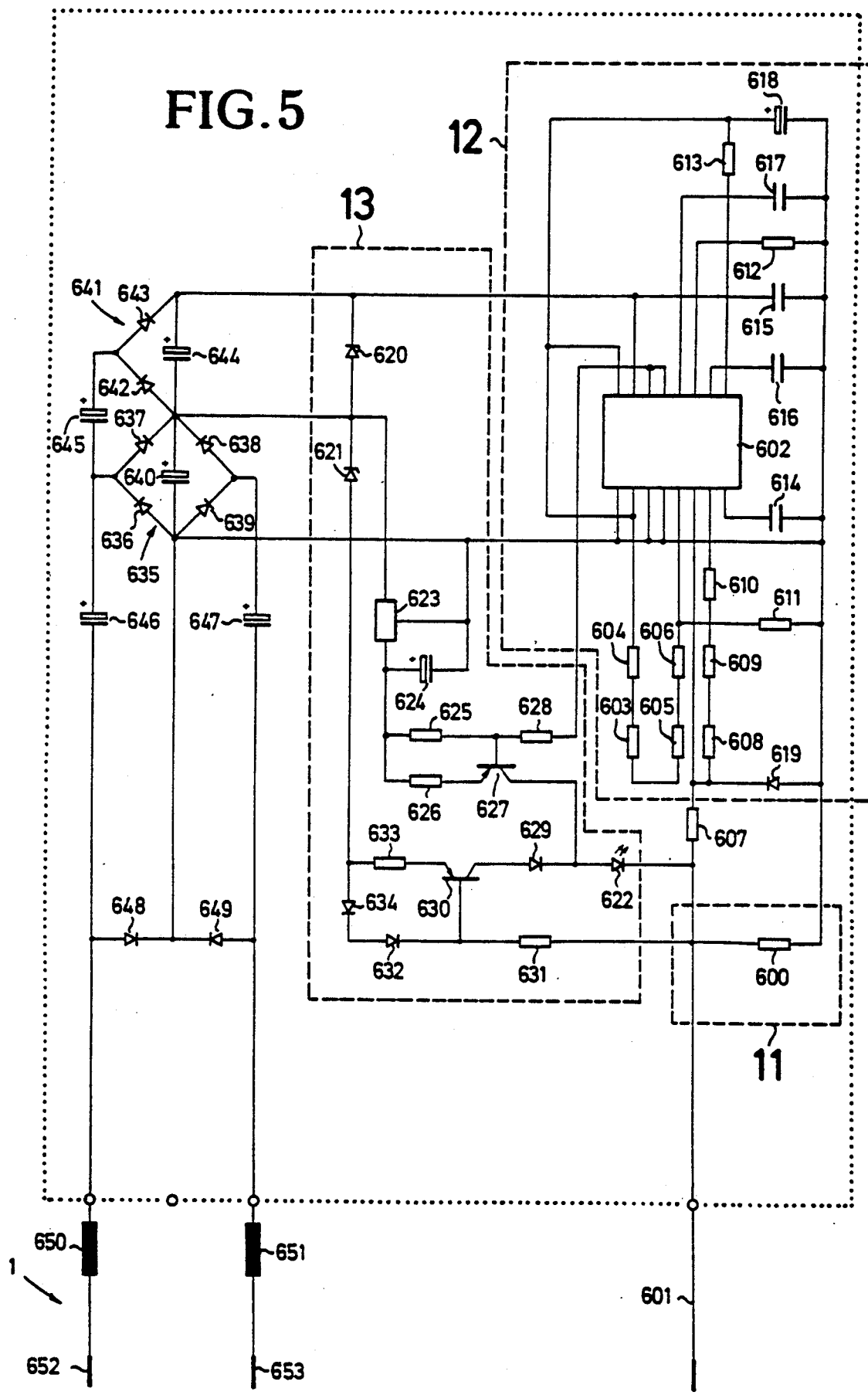
FIG. 5 pulse width modulation circuit, an infrared transmitter and a device to monitor emission current.

FIG. 5 shows in detail a device 11 for monitoring the emission current. It refers to a resistor 600 that is connected with a 15 kV line 601. The current that flows through this line corresponds to the emission current, whereby the current decreasing at the resistor 600 is proportional to the emission current. This voltage is fed to a pulse width modulator component 602. The latter is wired to several resistors 603 to 613, capacitors 614 to 618 and one diode 619. The power supply of the pulse width modulator 602 is provided by a cascade connection 635 with the components 636 to 647. Limiting of voltage is carried out by diodes 620, 621. The voltage regulator 623, with a capacitor 624 switched parallel to it, is connected across a resistor 625 to the base and across another resistor 626 to the emitter of a transistor 627. There is also a connection from the base of this transistor 627 to the input of component 602 across the resistor 628. The collector of transistor 627 is connected to the cathode of a diode 629, as well as, to the anode of a light emitting diode 622. The anode of the diode 629 is located at the collector of a transistor 630, whose base is connected to resistor 631 and to the cathode of a diode 632 and whose emitter is connected to the anode of the diode 634 across the resistor 633. The anode of this diode is connected at the same time to the anode of the Zener diode 621.

The high-voltage is connected to the terminals 652, 653 of the thermionic emitting cathode 1 across the resistor 600, the diodes 648, 649 and across the inductivity (inductive resistor) 650, 651.

We claim:

1. Device for a power supply of a thermionic emitting cathode 1, particularly for an electron source of an electron vapor deposition device, comprising:

a) a transmitter 19 having its primary windings 417 connected to a pulse width modulated medium frequency of approximately 25 kHz, whereas its secondary windings are connected to said glow cathode 1;

b) a control device 4 comprising a switchable cathode heating current controller 109 and a switchable emission current controller 110, said cathode heating current controller 109 being supplied with the difference between the attempted cathode heating current ($I_{Hsoll}$) and the actual cathode heating current ($I_{Hist}$), whereas the emission current controller 110 is supplied with the difference between the attempted value of the emission current ($I_{Esoll}$) at the actual emission current ($I_{Eist}$);

c) a device 11 being responsive to the actual emission current ($I_{Eist}$) of the glow cathode 1 and supplying it to a pulse width modulator 12, said modulator 12 supplying the pulse width modulator 16 with said pulse width modulated emission current ($I_{Eist}$) via a potential free way 14, said modulator 16 providing the control device 4 with an analog signal ($I_{Eist}$);

d) a pulse width modulator 17 which pulse width modulates the heating current supplied from the control device 4 and which supplies said modulated current via a power amplifier 102 to the primary winding of said transmitter 19; and e) a device 18 being responsive to said pulse width modulated heating current ($I_{Hist}$) from the control device 4 and supplying it to the control device 4 as an actual value.

2. Device per claim 1 distinguished by the fact that a controller (4) is provided with which the heater current ($I_{HC}$) or the emission current ($I_{EC}$) of the thermionic emitting cathode (1) can be controlled.

3. Device per claim 2 distinguished by the fact that the controller (4) has a cathode heater current controller (109) and an emission current controller (110), such that the cathode heater current controller (109) is supplied with the difference of the cathode heater current nominal value ($I_{HC\ nominal}$) and the cathode heater current actual value ($I_{EC\ actual}$), whereas the emission current controller (110) is supplied with the difference of the emission current nominal value ($I_{EC\ nominal}$) and the emission current actual value ($I_{EC\ actual}$).

4. Device per claim 3 distinguished by the fact that the one of the output or control signals of the cathode heater current controller (109) and that of the emission current controller (110) are fed to a pulse width modulator (104), whose output signals control a power amplifier (102), which supplies the primary of the transmitter (19).

5. Device per claim 1 distinguished by the fact that the device (11) feeds emission current ($I_{EC\ actual}$) to a pulse width modulator (12) that converts the emission current ($I_{EC\ actual}$) into a pulse width modulated optical signal (14) which is received by an optical receiver (15), which supplies the pulse width modulated signal ($I_{EC\ actual}$) to a demodulator (16), which reconverts the signal into electrical current ($I_{EC\ actual}$).

6. Device per claim 1 distinguished by the fact that heater current ($I_{HC\ nominal}$) tapped at the transmitter (19) is fed to an effective value generator (106).

7. Device per claim 2 distinguished by the fact that the emission current ($I_{EC\ actual}$) is fed to a limiting value device (112), which influences pulse modulator (104) directly through an activating device (6) when the limiting value of the emission current ($I_{EC\ actual}$) is exceeded.

8. Device per claim 2 distinguished by the fact that the effective value generator (106) influences a pulse width modulator (104) directly.

9. Device per claim 1 distinguished by the fact that a passive current limiting device (700) containing ferrite cores is provided serial to the thermionic emitting cathode.

10. Device per claim 1 distinguished by the fact that the transmitter (19) is a ferrite transformer pulsed at 25 kHz.

11. Device per claim 2 distinguished by the fact that the control device switches from heating current control to emission current control automatically.

12. Device per claim 11 distinguished by the fact that during the heater current control an external nominal value ($I_{HC\ nominal}$) is compared to an actual value tapped at the primary of the transmitter (19).

13. Device per claim 11 distinguished by the fact that during the emission current control a given value of the emission current is controlled, such that this value is determined by an external nominal value.

14. Device per claim 13 distinguished by the fact that the emission current actual value is tapped internally through an optical value transmitter and directly from a high-voltage side of the cathode and supplied as an analog signal for monitoring the emission current value.

15. Device per claim 14 distinguished by the fact that the actual value of the emission current can be switched in four amplification stages by two external digital signals.

* * * * *